United States Patent [19]

Novak

[11] Patent Number: 4,514,858

[45] Date of Patent: Apr. 30, 1985

[54] LITHOGRAPHY SYSTEM

[75] Inventor: W. Thomas Novak, San Jose, Calif.

[73] Assignee: Micronix Partners, Los Gatos, Calif.

[21] Appl. No.: 475,430

[22] Filed: Mar. 15, 1983

[51] Int. Cl.³ .................. G01N 21/00; G01N 23/00; G03B 41/16

[52] U.S. Cl. ................ 378/034; 250/491.1; 250/492.2

[58] Field of Search .............. 378/34, 35; 250/491.1, 250/492.2

[56] References Cited

U.S. PATENT DOCUMENTS

| | | | |
|---|---|---|---|
| 4,335,313 | 6/1982 | Kreuzer et al. | 250/492.2 |
| 4,403,336 | 9/1983 | Taniguchi et al. | 378/35 |

Primary Examiner—Alfred E. Smith
Assistant Examiner—T. N. Grigsby
Attorney, Agent, or Firm—Thomas S. MacDonald; Alan H. MacPherson; Richard Franklin

[57] ABSTRACT

A lithography system for X-ray or other beam printing on a substrate such as a silicon semiconductor wafer comprises a beam chamber (301), a beam source (302), means (309) for mounting a mask, means (308) for mounting an image sensing means (342) interiorly of the chamber, means (317, 318), for mounting a substrate (307) in multiple including six degrees of freedom and means (308, 292, 320–322) including the image sensing means to align the mask and substrate relative to one another utilizing alignment patterns on the mask and substrate, images of which are brought into registration and sensed by the image sensing means. In a preferred embodiment three sets of target images are provided so as to adjust the substrate and mask relative orientation in six degrees of freedom. The mask seals helium within the chamber. The mask and the substrate are aligned in situ in the same position in which the mask and substrate are to be exposed to the beam. Means (313, 314, 311, 312) are provided for loading masks, calibration assemblies and substrate-holding means. The source-to-substrate distance is adjustable as is the mask-to-substrate gap. To conserve helium volume adjustable optic objectives (342) are provided in the chamber to sense registration of alignment targets on each of the mask and substrate, with essentially the remainder of the optics outside the chamber. Improved compression optics (408) are also provided in the alignment system.

4 Claims, 20 Drawing Figures $RN = fN\lambda$
$\lambda = .633$
$N = 1, 2, \ldots 15$

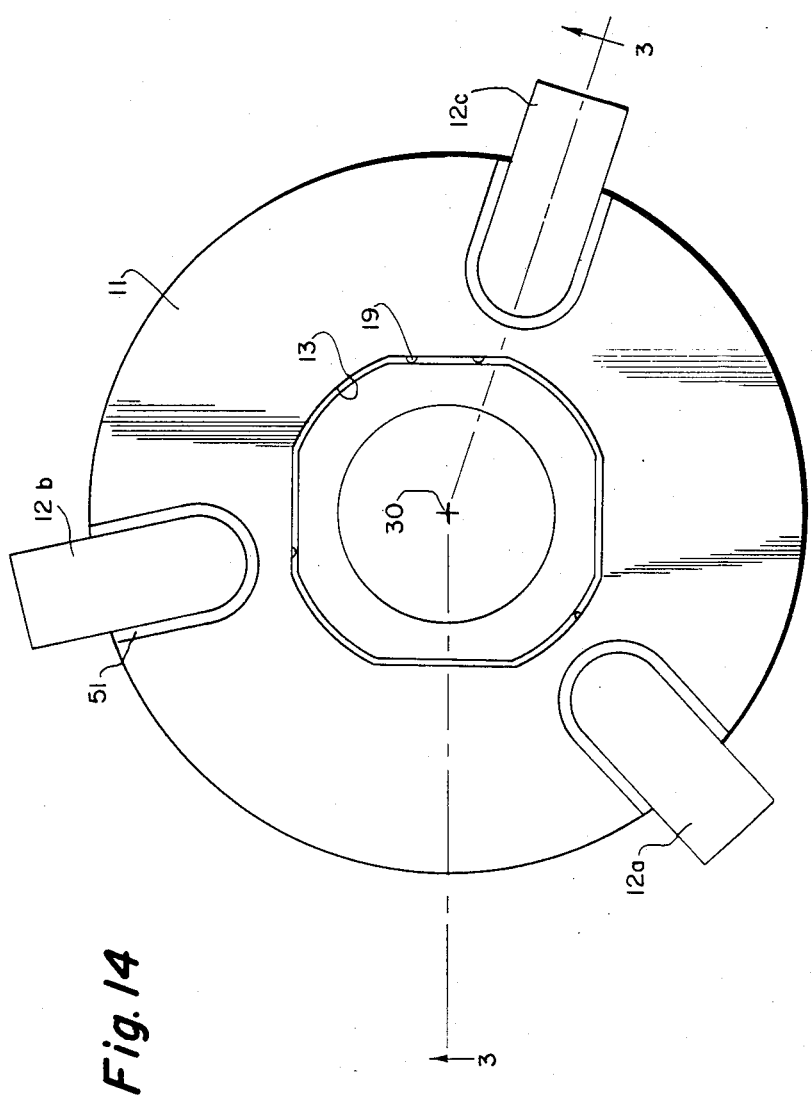
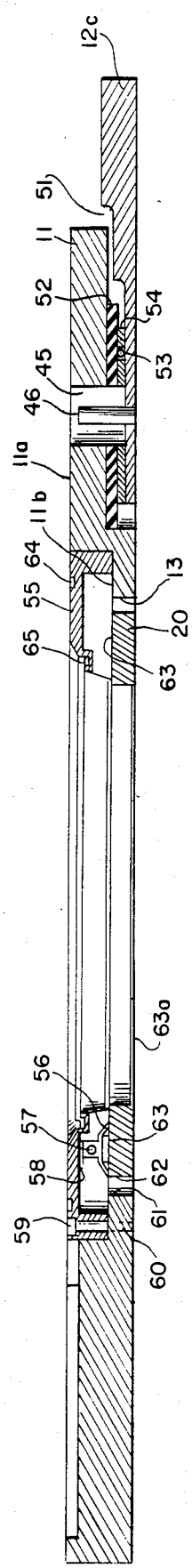
Fig. 14
Fig. 15

Fig.16
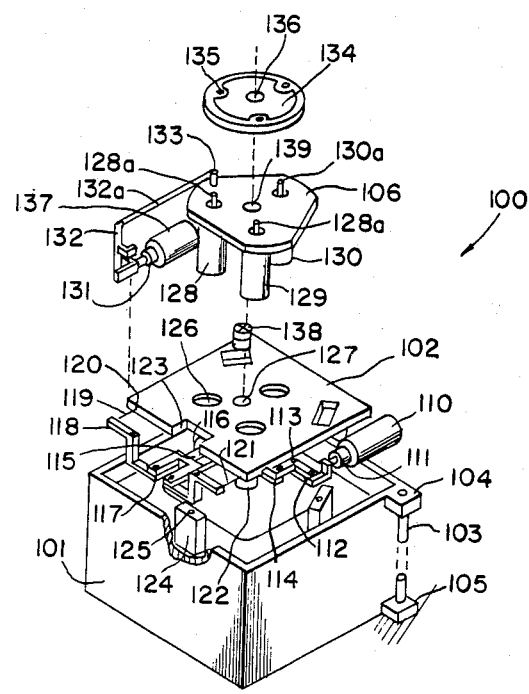
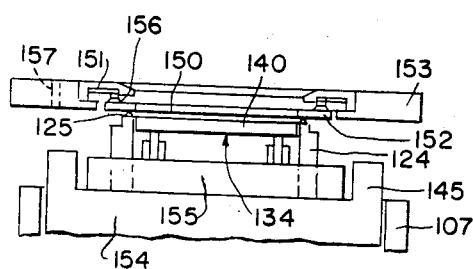
Fig.17

LITHOGRAPHY SYSTEM

CROSS-REFERENCE TO RELATED APPLICATIONS

This invention relates to and may be utilized with that invention shown in U.S. application Ser. No. 06/475,427, filed Mar. 15, 1983, entitled "Mask Alignment Apparatus" by Anwar (NMI) Husain, Inventor; U.S. application Ser. No. 06/475,420, filed Mar. 15, 1983, entitled "Alignment Apparatus" by Lawrence M. Rosenberg, Inventor; U.S. application Ser. No. 06/475,428, filed Mar. 15, 1983, entitled "Optical Objective Adjusting Apparatus" by Frank G. Kadi, Inventor; and U.S. application Ser. No. 06/475,439, filed Mar. 15, 1983, entitled "Mask Loading Apparatus, Method and Cassette" by W. Thomas Novak and Peter Jagusch, Inventors. The subject matter of the above recited applications are herein incorporated by reference.

BACKGROUND OF THE INVENTION

This invention relates to an lithography system particularly usable in the fabrication of integrated circuits from silicon wafers or in printing on various other substrates. It includes improved techniques insuring precise alignment of multiple masks to define circuit or other features on a substrate at various levels or locations of the fabrication process.

The fabrication of integrated circuit electronic devices involves having a series of masks or a series of wafers be successively aligned with respect to each other. To obtain reasonable yields in the manufacture of such devices, precise tolerances are required in the alignment process. For very high-resolution devices, sub-micron alignment tolerances are normally necessary.

The invention utilizes zone plate technology to image alignment patterns in the lithography system with an improved wafer stage subsystem adjustable with respect to registration of such alignment patterns.

It is also desired that the lithography apparatus/system be as compact as possible so as to have the smallest possible "footprint", with attendant savings in clean room space, and to be highly automated. This is accomplished in part by including an improved mask transport system and mask alignment apparatus and incorporating alignment objectives or other image sensing means within a beam column with an improved miniaturized adjusting means affording high resolution.

PRIOR ART

X-ray lithography, wherein soft X-rays are substituted for visible or ultraviolet radiation, has been used as a submicrometer lithographic technique that is fairly high in throughput and relatively inexpensive. In such X-ray lithography systems X-rays of 4-50 Angstroms wavelength are used to print replicas of gold patterns, of electronbeam generated masks on photo-sensitive materials on semi-conductor substrates such as silicon wafers. Various illumination schemes have been employed in these X-ray lithography systems.

Zone plate patterns typically utilizing circular Fresnel zone plates have been disclosed in U.S. Pat. Nos. 4,037,969 and 4,326,805. The '969 patent includes a single set of concentric ring alignment marks having markings of high and low reflectivity on both a wafer and a mask, the patterns of which may be aligned in a common focus plane of a microscopic objective. Movement of wafer with respect to the mask is carried out until the spots appear in prescribed space relation in an imaging plane. This technique may be employed in an automated system in which a photoconductor control unit and micropositioner automatically positions the spots in registration. In the '805 patent an off-axis incident beam is provided which is reflected and focused by each of a pair of multi-spot patterns on an image plane above the mask member. It provides for correction of X, Y-axis, or $\theta$ misalignment (magnification errors) and gap separation between the mask and wafer.

U.S. Pat. No. 4,185,202 discloses an X-Ray lithography system wherein the mask and wafer are optically aligned outside the X-rays source and imaging chamber and subsequently moved into the imaging chamber. This necessitates purging of chamber on each alignment operation and is a procedure which risks misalignment in moving the mask-wafer setup into position under the source for each exposure. A separate helium gas flow is provided between the mask and wafer in a controlled environment separate from the X-ray propagating chamber.

SUMMARY OF THE INVENTION

The present invention provides an improved alignment system from that shown in U.S. Pat. Nos. 4,307,969 and 4,326,805 while utilizing the principles of operation of such patents. Zone plates or other means forming linear or line images may also be utilized. The zone plates shown in the '805 patent, for example, provides for adjustment of the wafer in four degrees of freedom namely the X and Y axis, $\theta$ which is the rotation movement of the wafer in the X-Y plane, and the gap distance Z-axis between the mask and wafer. Significant error is still possible however since the wafer center is shifted if the gap at the left and right sides of a wafer between the wafer and a reference plane (such as the top of the wafer mounting stage) is changed by $-\Delta$ and $+\Delta$, respectively. These two remaining degrees of freedom are compensated for by adding a third alignment objective or other image sensing means to the system and a third set of alignment mask targets. Improved compression optics are also disclosed for permitting display of otherwise dispersed alignment spots on an imaging camera.

In X-ray lithographic applications due to the noncollimated nature of X-rays, significant displacement of the microscope objectives relative to the X-ray source in the prior art also contribute to registration errors. In this invention the mask and substrate, be it a wafer or other device, are movable with the objectives fixed minimizing registration errors and reducing system complexity. The three objectives are located within a helium chamber extending below the X-ray source. They are moved in and out of the X-ray beam exposure path but at all times remain in the helium column. The remainder of the optics system is outside the column greatly reducing the volume of the column and reducing the amount of helium gas.

Means, including a piezoelectric motor and a two-lever flexure system, are provided to independently adjust the objectives so as to align the alignment marks. Means are also provided to automatically transfer masks and a sequence of wafers into position relative to the helium chamber where the mask-wafer alignment is performed. In position the mask acts as a positive seal for the bottom of the helium column during fabrication of wafers, thus conserving helium and avoiding constant purging of air from the column.

Adjustment of the wafer, which may be mounted on a conventional pin chuck (U.S. Pat. No. 4,213,968), is by an improved piezoelectric stage subsystem. The chuck is supported at three points by three piezoelectric linear motors which in differential motion tilt the chuck in two-axis movement or in equal motion move the wafer in the Z-axis direction to accommodate wafers of various thickness and to alter the mask-to-wafer gap, respectively. These motors are attached to wafer chuck by flexures and are mounted on a theta plate which is rotatable by a fourth piezoelectric motor. This assembly is attached to an X-Y motion plate which is supported by air bearings and which can be driven in X and Y directions by two piezoelectric linear motors. The result is a stage of compact size which holds the wafer rigidly with virtually no backlash, yet moves the wafer in six degrees of freedom to perform total alignment at high resolution.

Means are also provided to easily adjust the wafer-to-source distance and/or the wafer-to-mask gap.

An improved mask cassette and transfer system and an improved mask holder and alignment system are also included in the overall lithography system.

The above broadly described components are housed in or on a single integrated structure which also includes the beam source, cooling means, vacuum means, power supply, blowers, and heat exchangers for the source, as well as mask and wafer cassettes and positioners, micropositioner controls, CRT display, and operator station, including binocular viewer, keyboard and controls, and other electronic control packages. A single relatively compact and small packaged system for a total lithography system thus results.

BRIEF DESCRIPTION OF THE DRAWINGS

FIG. 14 is a bottom view of a mask aligner apparatus.

FIG. 15 is a cross-sectional view of the apparatus of FIG. 14 taken on the line 3—3 of FIG. 14.

FIG. 16 is an exploded perspective view of a wafer adjusting apparatus used as the six-axis wafer stage.

FIG. 17 is a cross-sectional view illustrating the referencing of the objectives, mask aligner and positioner, the six-axis stage and the coarse Z-axis stage.

DETAILED DESCRIPTION OF THE DRAWINGS

Figure 1:
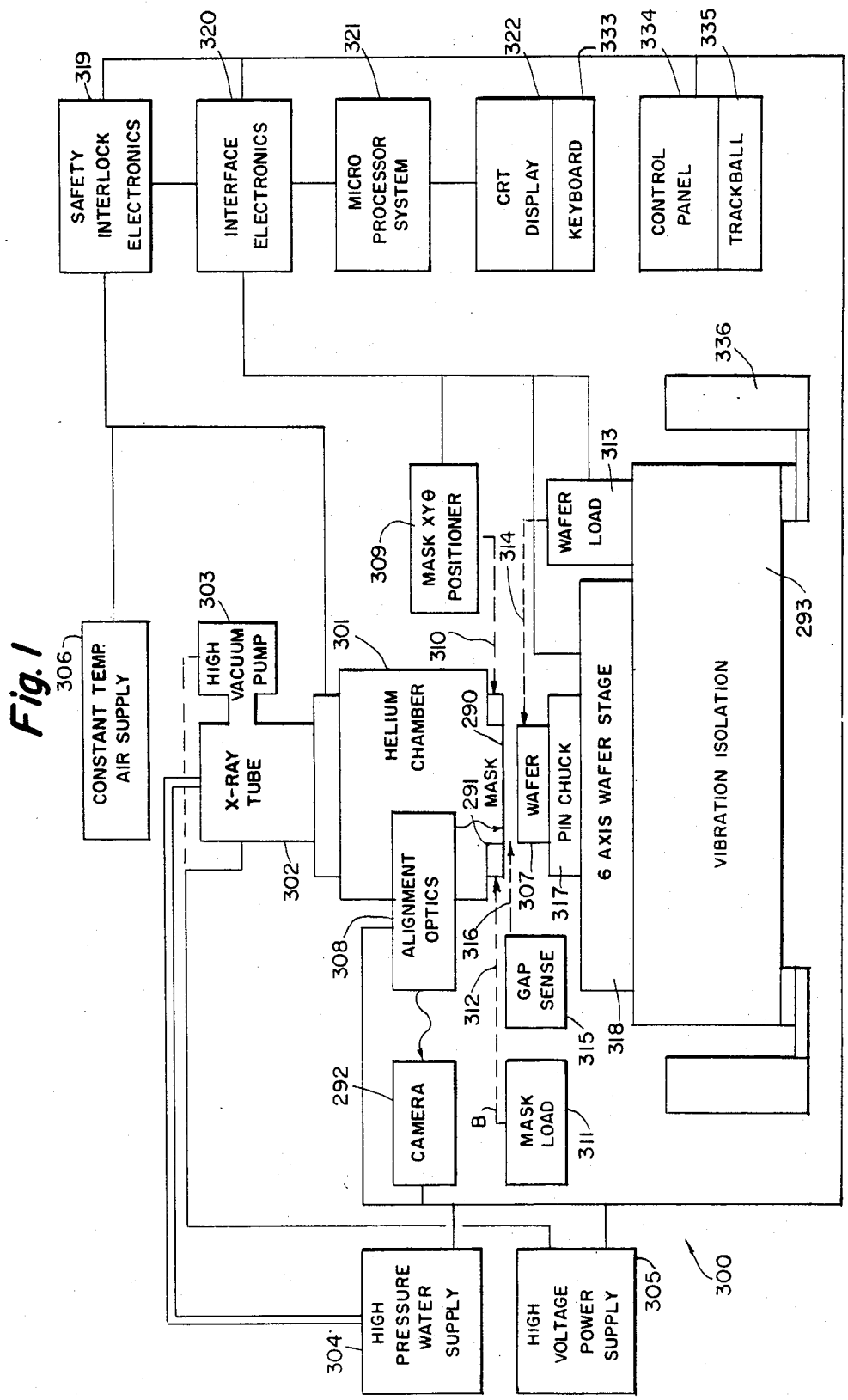
FIG. 1 is a block diagram of an overall X-ray lithography system.

The present invention has utility in various beam exposure type lithography processes, such as X-ray, ultraviolet, ion beam or optical beam wherein mask(s) are utilized to print a pattern on a substrate. "Substrate" as used herein, include silicon wafers, wafers of other semiconductor material, magnetic or optical discs, surface acoustic wave devices or the like.

The invention is hereafter described in terms of X-ray lithography. The X-ray system 300 includes a substantially centrally located helium chamber 301 that provides an X-ray transmissive atmosphere above the mask top surface. Helium is chosen for its low atomic number and weight which will not appreciably affect the X-ray beam. A vacuum or other controlled environment may be alternatively provided in the chamber. An X-ray source 302 is movably positioned above the helium chamber, which alternatively may be provided with a high-vacuum pump 303. A high-pressure water supply 304 for cooling, and a high-voltage power supply 305 is included. The X-ray source may be of the liquid-cooled, stationary target type design which is seen in U.S. Pat. Nos. 4,238,682 and 4,258,262 and in the *Journal of Vacuum Science Technology* (1979), Volume 16, No. 6, page 1942, J. R. Maldonado, et al. A palladium anode is used in the X-ray source where X-rays are generated by electrons bombarding the palladium anode. This anode material is well matched to chlorinated resists contained on the wafer top and results in increased immunity to organic dust particulates compared to longer wave length radiation. The resists are efficiently blocked out by a relatively thin layer of gold as an absorber of the X-rays. A beryllium window of a thickness of about 50 micrometers and an X-ray mask having 4 micrometers of boron nitride and 6 micrometers of polyimide is utilized. Table 1 represents the parameters of an X-ray source, usable with this invention.

TABLE I

| X-Ray source Specifications | |
|---|---|
| Input Power | 6 kW |
| Effective X-Ray Spot Diameter | 4.0 mm |
| Anode Material | Palladium |
| Cone ½ Angle | 12.5 Degrees |
| Accelerating Voltage | 25 kV |
| Beryllium Window Thickness | 50 m |
| X-Ray Emission Field ½ Angle | 8 Degrees |
| Life Expectancy, Minimum | 2000 Hours |

A mask 290 is positioned at the lower end of helium column or chamber 301 in sealing position so as to prevent other than controlled egress of helium. The mask is mounted in a mask holding and alignment mechanism 291. A semiconductor wafer 307 is mounted on a pin chuck 317 below the wafer 290 and spaced therefrom. Alignment optics 308 are provided to perform the alignment of the mask and wafer as hereinafter described. Basically only the objectives or other image sensing devices are contained in the column 301 with the remainder of the optics exterior to the chamber. Thus this greatly minimizes the chamber volume. The alignment optics are used in the registration of imaging markings on each of the wafer and mask so as to align the mask and wafer while they are positioned below the helium chamber. The image sensing means may be the aforesaid optical objectives or a charged coupled device (CCD), silicon sensor or the equivalent which can directly sense the target images from the mask and substrate. A mask positioner 309 holds the mask to the bottom of the helium chamber at position 291.

A mask loader 311 is provided for moving a sequence of masks into the mask holder and positioner 309. Masks are transported by a transport means 312 into the mask positioner and aligner. Likewise, a wafer or other substrate-loading mechanism 313 holds a stack of wafers and is adapted to load a wafer on a wafer transport means 314 into position on chuck 317. Wafer chuck 317 is mounted on a six-axis wafer adjusting stage 318 which is vibrationally isolated from a fixed support 336 by conventional means 293.

The present invention includes movement of the stage (or the mask) with alignment marks over the entire wafer, i.e., at the peripheral edges of the wafer, or marks may be placed around each or a group of die locations on the wafer since many dies are made from one wafer. The apparatus can then be used in so-called step and repeat operations at different locations on a single wafer or other substrate. In such step and repeat operations, it may be possible to do only one alignment of the wafer to obtain satisfactory print resolutions, but in other instances where the needed resolution requires it, realignment is done with respect to the marks around a single die or a group or array of dies. In either event, as later described, the print exposure to the beam is done at the same in-situ position below the helium or other beam chamber where the mask and substrate are aligned. After alignment, there is no relative motion of the mask and substrates or of the mask and substrate together except for permitted motion of one in the above-described step and repeat operations where it is not necessary to realign for the desired resolution of the printed image.

Safety interlock electronics 319, interface electronics 320, and a microprocessor system 321 connected to a CRT display unit 322, a keyboard 333, control panel 334 and track ball 335 control the positioning of the masks and wafer and their alignment utilizing the alignment optics 308 and the camera 292.

Figure 2:
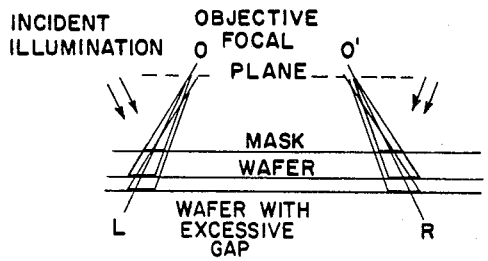
FIG. 2 is a schematic drawing of the target imaging of the zone targets.

The alignment technique of this invention may use circular Fresnel zone plates of the general type that have been previously reported by Feldman, et al, *Journal of Vacuum Science Technology*, November/December 1981, Volume 19, No. 4, page 1224 and in *SPIE Submicron Lithography Proceedings* 1982, Volume 333, page 124. These papers show zone targets having a very large signal-to-noise ratio for various kinds of surfaces and oxide thickness and for thick-resist coatings. In the use of these techniques, the focused image is well defined and circular and its size determined by the numerical aperture of the zone plate, the microscope optics, the wavelength, and the spatial collimation of the laser illumination. Coarse alignment at low magnification is easily performed as the circuit elements on the mask add only a low-background signal compared to the focused points of light, when the alignment optics are focused in this plane. Another major advantage is that although the mask and wafer are separated by a considerable distance, no dual focus optics are required. This requirement is eliminated by simply making the focal length of the zone target on the wafer longer to compensate for the mask-to-wafer gap. Another advantage is that the incident illumination can be shifted off of the perpendicular to compensate for the pattern magnification which results from the noncollimated nature of the X-rays as shown in FIG. 2. It can be seen that if the mask-to-image gap is too large, the wafer signal is focused at a smaller radial distance from the center of the mask and appears as a shift compared to the mask location. Proper alignment occurs when the left and right wafer zone target centers are along the lines OL and OR', respectively. If, for some reason, such as processing or thermal change, the wafer pattern is linearly distorted compared to the mask pattern, the gap may be automatically increased or decreased, thereby changing the magnification by the amount necessary to compensate for the distortion.

Figure 3:
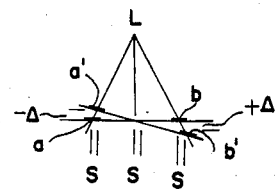
FIG. 3 dramatically illustrates the effect of wafer tilt on alignment accuracy.
Figure 5:
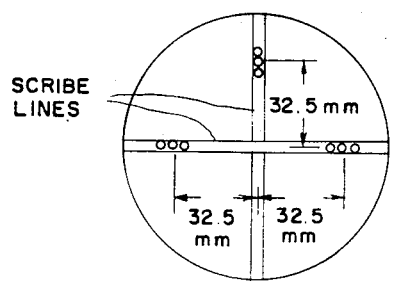
FIG. 5 illustrates the layout of the targets on the mask and wafer.

Using two sets of zone plates as shown, still results in significant error. First, there is a third dimension to consider. Second, as shown by FIG. 3, the wafer center has shifted by amount S if the gap at the left and right sides of the wafer is changed by $-\Delta$ and $+\Delta$, respectively. These two remaining degrees of freedom are compensated for by this invention by adding a third alignment objective to the system and a third set of targets. Each objective system yields apparent XY registration data and the proper manipulation of these six independent pieces of date allow movement of the wafer in six degrees of freedom for complete registration and gap control. It is important to note that the proper mask-to-wafer gap is determined without reference to small deviations from perfect focus of the spots. FIG. 5 shows the position of the third objective relative to the other two. In this configuration, the three objectives are at a radial distance of 32.5 millimeters from the center of the system, allowing the targets to be placed in suitably scribed lines, as shown. It is contemplated that other sets of objectives or image sensing means may be employed displaced from a line between two of the sets.

Due to the noncollimated nature of the X-rays, significant displacement of the microscope objectives, relative to the source, would contribute to registration errors. Therefore, in this system, the mask and wafer are movable with the objectives fixed, minimizing registration error and reducing system complexity.

Figure 4:
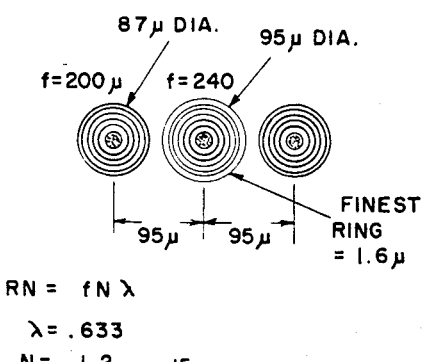
FIG. 4 illustrates the mask and wafer targets.

As seen in FIG. 5, there are three targets under each objective. This is necessary to eliminate undesirable coherence effects which result if the mask target is directly above the wafer zone target. FIG. 4 illustrates the details of the zone targets. The mask has two targets of 200 micrometers focal length while the wafer has one target of 240 micrometers focal length for a 40 micrometer mask-to-wafer spacing. The overall diameter of the wafer target is 95 micrometers and the center-to-center spacing between the mask targets is 190 micrometers. The zones are formed by radii $(Rn)^2 = fN\lambda$ where f is the focal length of the zone target, N is an integer, and $\lambda$ is the wavelength of radiation. The alignment targets shown have a maximum N value of 15 to form a reflective center with seven reflective rings.

Figure 6:
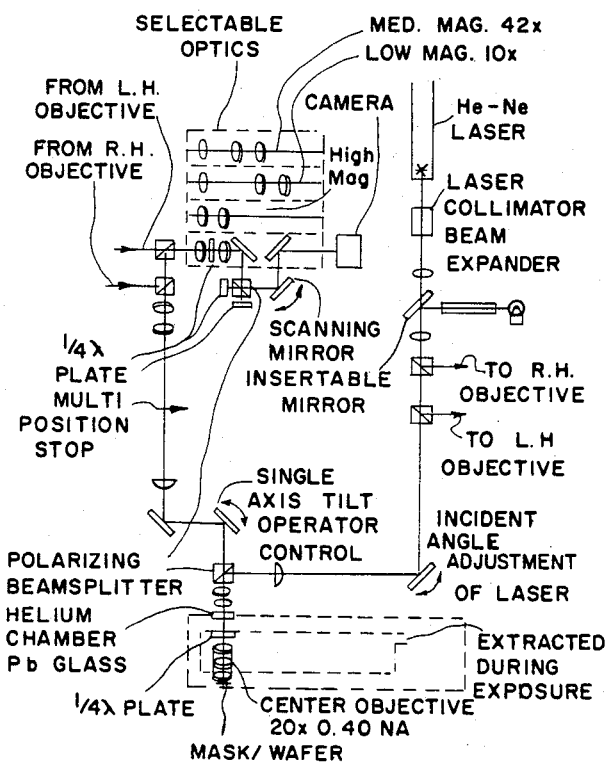
FIG. 6 is a schematic of the optics of the lithography system.
Figure 20:
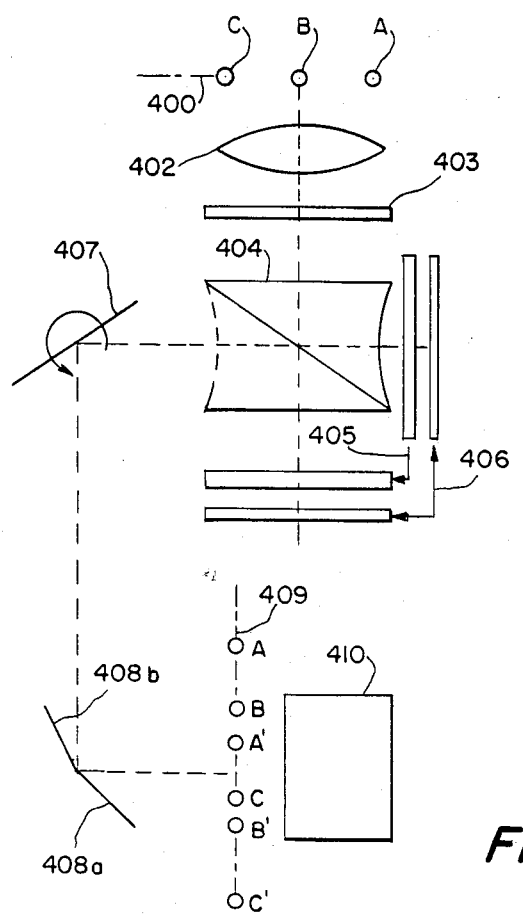
FIG. 20 is a schematic view of the improved compression optics.

An optical schematic of the alignment system is shown in FIG. 6. During alignment, an expanded and collimated laser beam is directed through a condensing lens which focuses the beam at the back focal plane of the objective. The beam, after reflecting from the mask or wafer, is transmitted through magnifying optics to a detector. Polarizing beam splitters and ¼-wave plates at the objectives are used to maximize the signal levels. For final alignment, a "compression optics" arrangement shown in FIG. 20 is utilized to bring the mask images into the view range of the camera. The FIG. 20 compression optic technique dispenses with the scanning mirror previously reported by Feldman, et al, in the *SPIE Proceedings* noted above. Without a compression optics subsystem, the high magnification used to magnify the focus points causes these points of light to be far off the face of the detector, thus giving no information as to the location of the mask.

The entire objective assembly (shown within dotted lines) is located within the helium chamber and is movable into aligning positions and out from the pathway of the exposure beams when fabrication operations are being performed on a wafer. Light from the objectives passes through a leaded glass window in the chamber to the remainder of the optics outside the chamber. The window keeps both X-rays and helium from escaping from the chamber. The selection of the objective used for viewing is made via a multi-position stop which blocks the light from the two objectives not selected.

A detection system is employed across the focus spot from the mask alignment mark. The half width is about 2.4 micrometers. The detector signal is electronically processed with an Intel 8086 microprocessor to determine the coordinates of the center of the spots which are formed on the detector such as the camera shown. When these coordinates of mask and wafer spots are known, alignment is straightforward and is performed by the hereinafter piezoelectric stage system.

Figure 7:
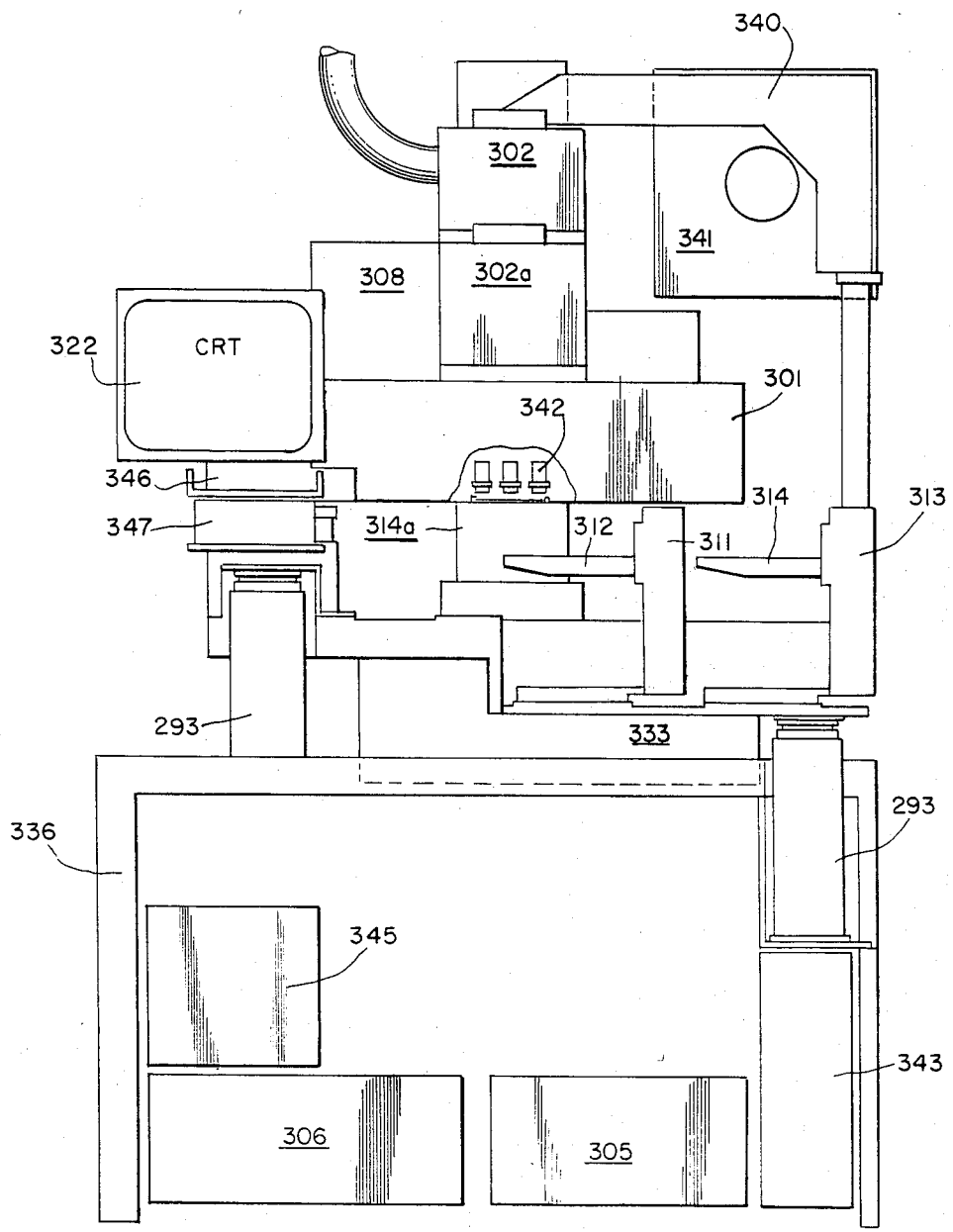
FIG. 7 is a front view of the X-ray lithography apparatus.

FIG. 7 shows a front view of the overall X-ray lithographic apparatus. The various parts of the apparatus are supported on a fixed frame 336 which, in its bottom confines, contains pneumatic packages 343, power supply 305, cooling and blower system 306 and electronic packages 345. The remainder of the apparatus is mounted on a vibration isolation system 293 extending from frame 336. The X-ray source 302 is mounted on the top of the helium chamber 301. Through the selection of an adaptive spacer means 302a of varying height the source-to-wafer distance may be adjusted. This is in the form of a series of collars or tubes of different heights which can be interchanged with one another or a telescoping chamber utilized to provide the desired spacing. The X-ray source may be removed from the apparatus by an integral crane 340 attached to the side of the frame 336. A filter for the air used to provide clear air inside the housing and helium supply is mounted at 341.

The remainder of the optics package 308 (that outside the dotted lines in FIG. 6) is mounted exterior of the helium chamber 301 and is in a optical pathway with a set of objectives 342 mounted within the column 301. The objectives are movable from a blocking position of the X-ray path so that the X-rays may be unimpeded in their travel to the mounted mask and wafer. An operator work station, including a control console and keyboard, communicates with a cathode ray tube display 322 to afford a visual observation of the alignment imaging targets and to show alignment of the target images after automatic adjustment of the wafer stage.

A mask cassette 346 or calibration assembly 347 is placed in an in-out mechanism which allows pick-up of the mask or calibration device or plate by a mask holding and transport device 346, 347. A wafer holding cassette and transport device (311–314) moves wafers one-by-one onto a wafer adjusting stage contained in housing 314a. The cassette mounts on platform 314 with unexposed wafers and indexed vertically by 313. A similar subassembly 312, 311 supports a cassette of exposed wafers.

The work or fabrication station of the X-ray apparatus includes the helium chamber, an adapter means for mounting the X-ray source, means for mounting a mask to seal off the helium chamber and means for mounting and adjusting a series of microscope objectives in the helium chamber.

Figure 8:
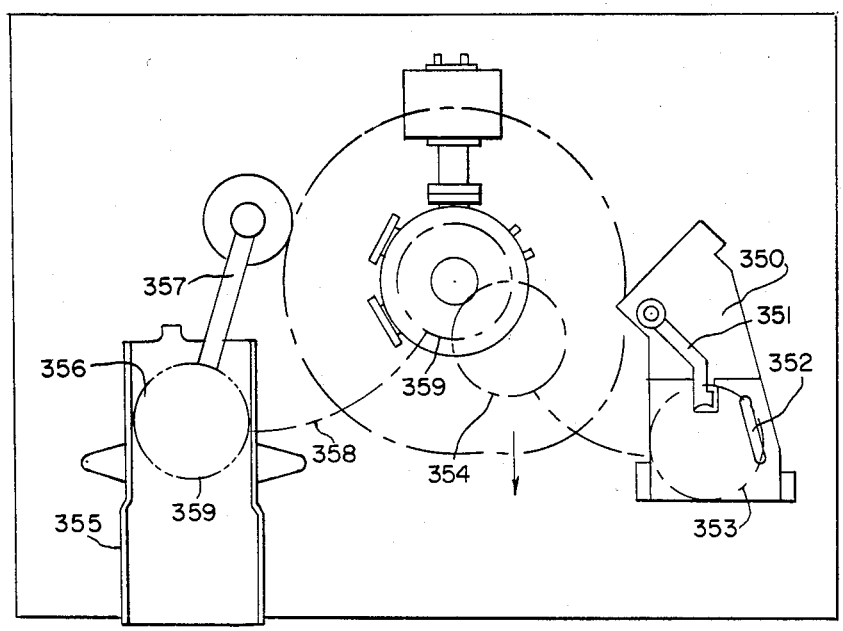
FIG. 8 is a top view of the apparatus, particularly showing the transport means for the mask and wafer into the central column.

FIG. 8 is a partial schematic top view of the mask and wafer transport systems which transport masks and wafers into position below the helium column and X-ray source. A wafer prealigner 350 is supported on base 333 and contains a pivoted arm 351 for transporting the wafer from a position 353 to position 354. Prior to movement on the transport arm 351, the wafer is aligned in prealigner 350 by lining up a flat on the wafer to a vertical roller 352 on the prealigner 350. After the wafer is loaded on the transport arm and properly oriented with its flat, the wafer is ready for movement to the wafer loading position. The wafer holding stage below the helium column first translates out from its position aligned with the helium column approximately 3" to an "out" position. The transfer arm 351 moves the wafer onto the top of the wafer stage while that wafer stage is in the "out" position. The stage then translates into axial position with the helium column for wafer fabrication operations. When that fabrication operation(s) are completed, the stage moves to the "out" position, and the finished wafer is blown off from the stage on an air track to a receiver cassette. The stage is then in an "out" position, ready to receive a new wafer transported by wafer arm 351.

Figure 18:
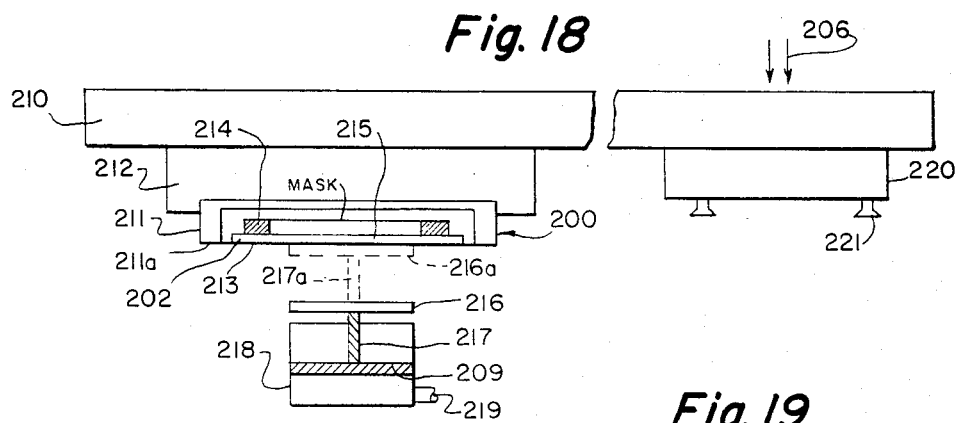
FIG. 18 is a partial cross-sectional schematic view of a mask transfer system from a mask cassette to the mask aligner in the apparatus center column.
Figure 19:
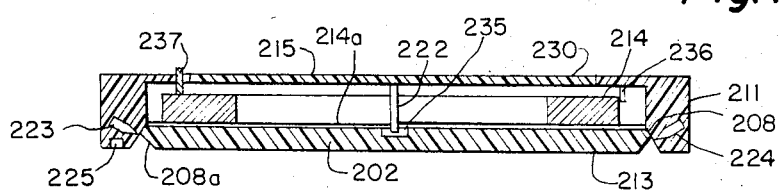
FIG. 19 is a cross-sectional view of the mask cassette.

FIG. 8 also shows a mask loading apparatus 355 which is more fully explained in FIGS. 18 and 19. The mask 356 is mounted at a position 359 on a arcuate moving arm 357 which moves the mask 356 into a central position 359 at the bottom of the helium column in sealing relation to the column. This mask is affixed to a mask-aligning device shown in FIGS. 13–15.

Figure 9:
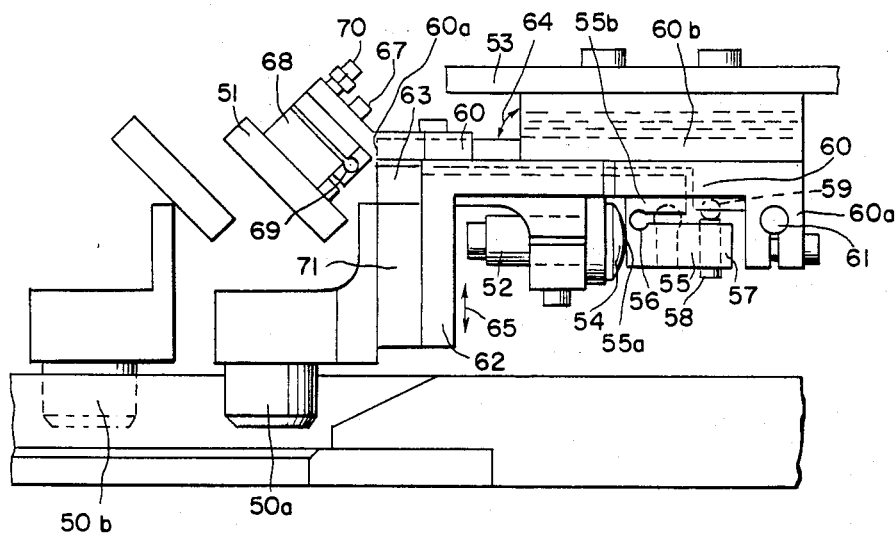
FIG. 9 shows a side view of an objectives adjusting means.
Figure 10:
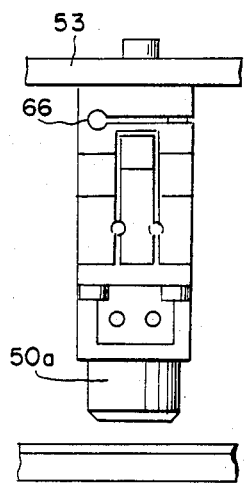
FIG. 10 is a rear view of an objective adjusting means.
Figure 11:
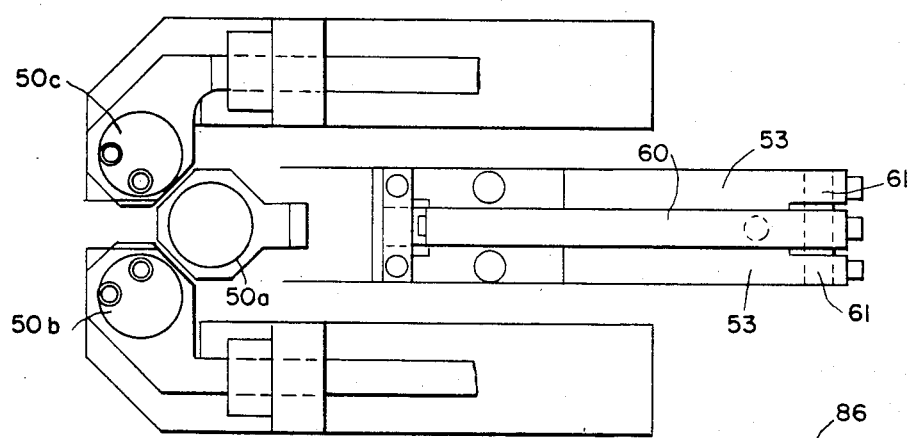
FIG. 11 is a top view of an objective adjusting means.
Figure 12:
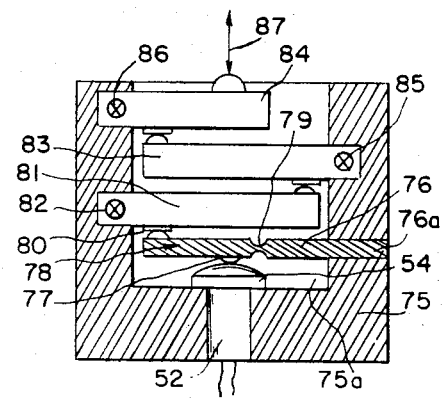
FIG. 12 is an alternate embodiment of the multilever system for adjusting the objectives.

FIGS. 9–11 show a preferred form of objectives adjusting apparatus used in this invention and lithography systems. FIG. 12 is an alternate embodiment of the lever system described.

FIG. 9 shows the details of one of three duplicate adjusting means, one for each of objectives 50a, 50b and 50c (FIG. 10). Dependent on the particular technical application, generally either one, two or three objectives are employed. Each may be individually adjusted in accord with the invention. A piezoelectric/motor 52 is provided which in response to an electrical signal initiates movement of a piezo output ram 54 over a small, accurately determined incremental linear distance against a vector force point 55a on a rearwardly extending lower first lever 55. Lever 55 is formed as the lower leg of a C-shaped flexure member, the upper leg 55b of which is secured to fixed support 53. The intermediate part of the C-shaped member is narrowed by a lateral bore so that it forms an integral flexible link 56 around which leg or lever 55 rotates. Lever 55 has a cantilevered end 57 containing an adjustable pin 58 extending from its top surface. Upon movement of the piezo ram outwardly (to the right in FIG. 2), fulcrum lever 55 flexes around flexure pivot 56, magnifies the incremental linear movement from the ram due to the fulcrum length and moves upwardly to allow pin 58 to push against a fixed ball 59 contained on a lower surface of a second forwardly extending upper lever 60 folded-back on but spaced from lever 55.

Lever 60 is supported by a journelled flexure pivot 61 extending horizontally from the sides of lever arm 60 to support frame arms 53. The flexure pivot 61 may be pressed fit into apertures at the ends of arms 53 and in second lever 60. The second lever is L-shaped having its short bottom leg 60a extending vertically downwardly. Leg 61a is journalled to receive a central portion of flexure 61. The long leg 60b of the lever extends forwardly and horizontally toward the device or objective to be moved.

Pin 58 exerts an upward force on ball 59 which pivots lever arm 60 upwardly around fixed flexure pivot 61 resulting in the forward end 60b being moved arcuately upwardly as shown by arrows 64, further magnifying, as a result of the second lever arm fulcrum length, the incremental movement of the ram 54. The sides 62 of objective mount 71 have a vertical tongue or groove which is adapted to ride vertically, as shown by arrows 65, in a groove or tongue contained on rails (not shown) fixedly attached with respect to support arms 53 which are attached to the system outer housing. Movement of piezo ram inwardly reverses the motion of the levers and objective due to the restorative force of the respective flexures. Flexure 61 acts as the restorative force to move the strip 63 and mount 71 downwardly.

A flat flexible strip 63 made from beryllium copper is fixed to and extends downwardly from end 60a of lever 60 to objective mount 71 and communicates the downward movement of lever arm 60 to give linear vertical movement to mount 71.

Connected to fixed support arm 53 is an adjusting means for the optical mirror 51. This comprises adjustment screw 67 wherein downward actuation of the screw forces optics-holding member 68 downwardly around flexure pivot 69. This is useful in providing for a minute adjustment of the angle leading from the objective 50a to the eyepiece (not shown). Flexure 66 (FIG. 10) is utilized to adjust the angular orientation of the objective.

Piezomotor 52 is fixedly supported with respect to support frame 53. These motors are available from Burleigh Manufacturing Company of Fishers, N.Y. and are sold under the trademark PZT Pushers. They include a series of clamps which allow movement of the piezo ram in linear incremental steps of $0.02\mu$ per step. Clamps are ceramic elements whose annular openings vary with imposed voltage.

FIG. 12 shows a three lever embodiment of the invention, a unit of which can be utilized to adjust each of the objectives. The piezoelectric linear motor 52 is fixed in a bottom wall of casing 75 with the motor ram 54 extending into lever cavity 75a. A first flexure 76 has an end 76a held in a wall of the casing. A narrowed bending link portion 79 is positioned between the fixed end 76a and a bearing 77 which abuts piezo ram 54. The outer end 78 of the flexure is positioned to abut through bearing 80 a first lever 81 mounted by flexure 82 at one end. Lever 81 abuts at its other end a second folded-back lever 82 mounted by flexure 85 on one end and containing a bearing on its other end which abuts a third folded-back (in the same direction as the lever 81) lever 84 mounted on flexure 86. Lever 84 has an output motion inward and outward as shown by arrow 87. This is the motion which then moves the objectives in their rails or other linear slide device.

Outward motion of ram 54 (upward in FIG. 12) moves end 78 up and contact 80 and arms 81, 82 and 83 down reversing the direction of arrow 87. Each of the flexures are "set" so that they have a downward return force so the abutting surfaces stay in contact. Conversely, inward motion of ram 54 (downward in FIG. 12) moves end down and contact 80 and arms 81, 82 and 83 up in the direction of arrow 87.

The use of the two and three lever folded-back flexure fulcrum system described above translates the minute accurate linear horizontal motion of the piezomotor ram to a large vertical arcuate motion of the forward end of the second lever (and a large vertical linear motion of the objective). By reason of the length of the respective fulcrum lever arms 55 and 60 in the two-lever embodiment, in a particular application of the adjusting means for objectives used in an X-ray lithography system for fabrication of semiconductor wafers, a 23:1 magnification of the piezo ram movement is provided. The system is very compact and of high accuracy and resolution, being able to have accurate placement of the objective within 0.4 microns. The travel magnifying system is completely free of bearing wear or clearance problems since there are no bearings, the system relying entirely on flexures connected to the lever arms to accurately magnify motion.

Figure 13:
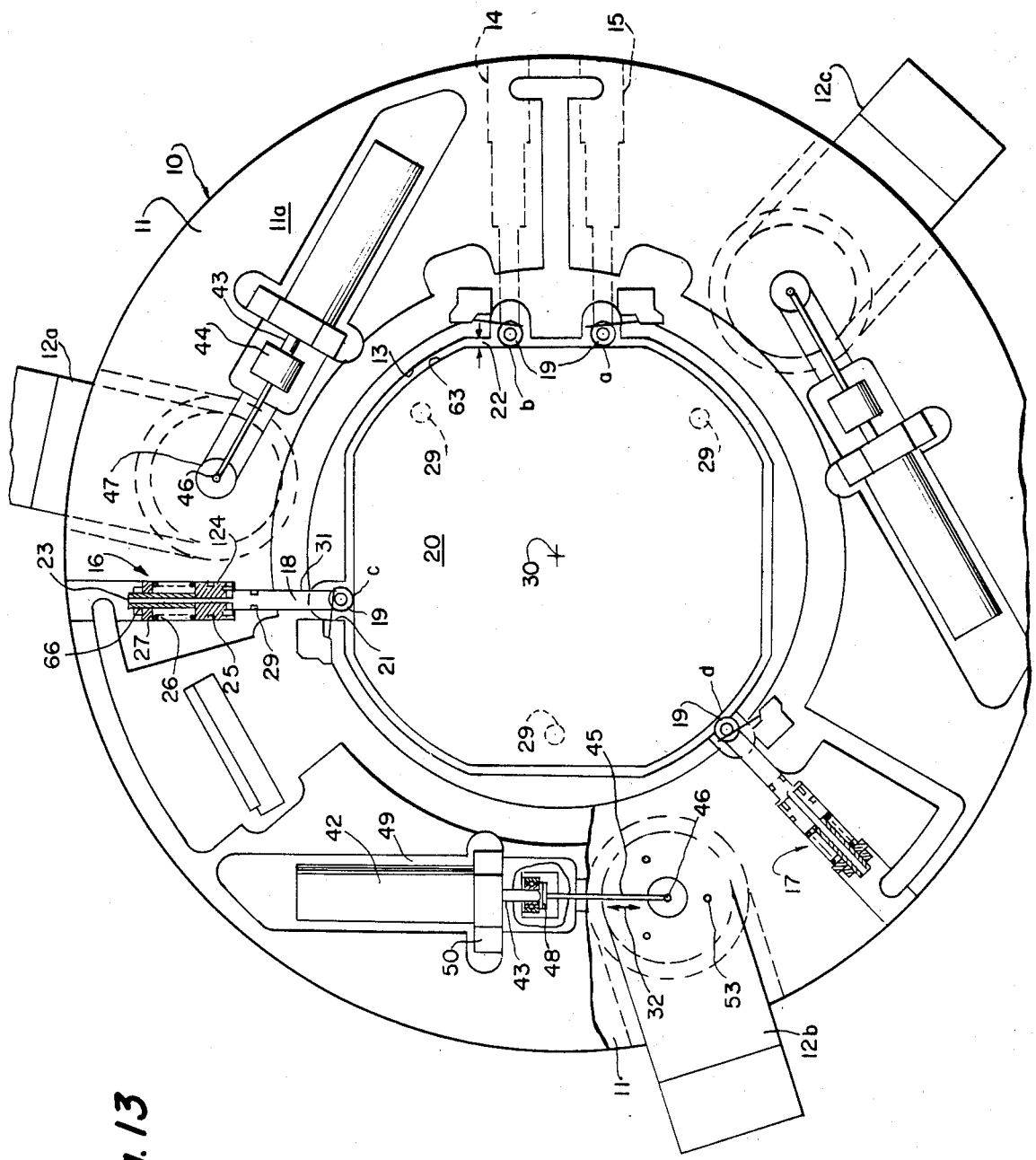
FIG. 13 is a top, partially cut away and sectional view of a mask alignment apparatus, useful in this invention.

FIGS. 13–15 describe the mask alignment apparatus used to coarse and fine align the mask with respect to the axis of the X-ray source and helium column.

The alignment apparatus 10 in FIG. 13 comprises a substantially planar ring plate 11 which is movable in a finite arc of rotation and along x and y axis coordinates with respect to fixed support fingers 12a, 12b and 12c which are rigidly mounted to a support structure (not shown). The support structure, in the case of an X-ray lithography system may be the main support frame of the X-ray apparatus or system.

Means providing for the coarse alignment of a mask 20 within an aperture 13 of ring plate 11 is first provided. Air cylinders 14–17 are positioned around the periphery of aperture 13 extending in a direction slightly off from a radial orientation. Each of the cylinders has a linear moving shaft 18 and a vertically extending roller bearing 19 attached at the inwardly facing end of the shaft 18. The roller bearings are positioned in a U-shaped recess 21 in ring plate 11. The cylinder-shaft-roller bearing assemblies are preferably positioned so that a pair of cylinders 14 and 15 are oriented alongside and spaced from the x-axis whereby a pair of roller bearings will abut mask 20 at points a and b spaced at a position of about 10° of arc from the x-axis. A third cylinder-shaft-roller bearing assembly is positioned so that cylinder 16 is offset about 10° of arc from the far side of the y-axis away from cylinder 14 so as to be in contact with mask edge at point c. Cylinders 14, 15 and 16 are first energized to bring roller bearings into fairly close contact with the peripheral vertical outside edge 63 of mask 20. Roller bearings 19 are normally spaced a distance 22 outwardly from the inner edges of aperture 13. A fourth cylinder-shaft-roller assembly is positioned radially opposite the first three assemblies and is last energized so as to move its roller bearing against point d on the mask edge toward central axis 30 forcing points a, b and c into close rigid-holding contact with the mask edges. Mask 20 is held rigidly in ring 11 with the mask central axis in close registration with the central axis of ring 11. Positions 29a represent the areas where registration pads 125 (FIG. 17) abut the rear of the mask.

Each of the cylinders 14–17 comprise a hydraulic or pneumatic entry port 23, a piston 24 movable in the cylinder casing, an O-ring seal 25 held by the piston and slidable on the casing inner walls and a return spring 26 between the top of piston 24 and a cylinder rear closure 27. A shaft O-ring seal 29 is provided which slides on the inner walls of a shaft conduit 31. The roller or other bearings are mounted for rotation on a pin (not shown) mounted on the end of shaft 18. Nuts 66 can be adjusted so as to move the various shafts and roller bearings inward and outward to coarsely set the longitudinal axis 30 of the mask in the desired orientation. Once the mask has been centralized in the opening, vacuum is applied to the three vacuum cups 29 thus retaining the mask in position. The air cylinders are then retracted and the mask is supported solely by the flexurally mounted vacuum cups.

Fine adjustment of the now rigidly mounted mask is provided by a series of three small accurate linear motors 40, 41 and 42 mounted in a recess 49 in top surface 11a of ring 11. Each motor has a linear moving shaft 43 which is affixed by a coupling 44 to a first end of flexible wire 45 which has sufficient stiffness to act as a push rod. The other second end of wire 45 is fixedly connected to a rigid post 46 upstanding from a central position on each of the support fingers 12a, 12b and 12c. Post 46 extends upwardly through a recess 47 in ring plate 11. The first end of the flexible wire is clamped into a roller bearing sleeve 48 which is bonded on the outer end of shaft 43. Linear motor 42, is mounted by bracket 50 at the bottom of the elongated recess 49. The attachment of flexible wire 45 to post 46 is thus medially of the vertical height of ring 11.

Motors 40–42 are peripherally spaced between the coarse locating pneumatic cylinders 14–17 around ring 11 at 120° spacing to each other. Movement of the shaft 43 linearly into the motor housing of motor 42, as indicated by arrow 32, for example, shortens the span distance between fixed bracket 550 and the rigid post 46 on fixed support finger 12b, thus rotating ring plate 11 counterclockwise in the shown plan view with respect to fixed finger 12b. Ring 22 is thus rotated a number of degrees of arc toward post 46, if all three motors have equal inward shaft movement. The net result is a pure rotative $\theta$ movement of ring 11 (and fixed mask 20) around axis 30. The flexible nature of wires or rods 45 allows the ring to subtend an arc which slightly changes the angularity of wire 45 with post 46 to rotatively adjust ring 11 (and the mask 20 rigidly affixed thereto). The amounts of shortening and pulling of ring 11 toward post 46 is limited by the spacing 51 between holes 47 and pins 46.

The wire or rod 45 acts as a push rod to move the ring in a clockwise direction in the plan view shown in FIG. 13 when shaft 43 of each motor is run linearly outwardly from bracket 550. This outward movement pushes ring 11 in a clockwise direction away from fixed fingers 12.

If linear motors 40, 41 and 42 are separately operated in one linear direction, or operated in groups of two in one linear direction, e.g., "in", and if the other opposed motor(s) are operated in the opposite linear direction, i.e., "out", the result is movement of the ring 11 (and wafer 20) in the x or y axis directions or in a direction representing a combination of x and y coordinates so that the central axis 30 (or any other particular point on the mask) can be accurately positioned on the x and y coordinates. The "in" and "out" movements of the motors is normally automatically controlled by suitable computer means in a microprocessor.

FIG. 14 shows the bottom underside of the mask alignment apparatus. The orientation of mask 20 held in aperture 13 of a ring plate 11 is seen. Roller bearings 19 align the mask peripheral edges. Ring 11 is rotatively and linearly movable with respect to fixed support fingers 12a, 12b and 12c.

FIG. 15 is a cross-sectional view of the mask alignment apparatus. It is to be noted that the entire mask holding and mask positioning means are in a flat overall structure having a thickness in a preferred embodiment of only one inch. The lateral dimension is approximately 13 inches. A mask-holding inner ring 555 is mounted on an inwardly-facing flat ledge 11b extending below top surface 11a. Screws 559 mount the periphery of inner ring 555 to threaded apertures 560 in ledge 11b. A vacuum cup 556 is mounted by flexure 558 to the underside of ring 555. The vacuum cup is mounted to permit distortion free retention of the mask and to permit vertical motion of the mask during gap setting and planarization without any change in its X-ray locations. The flexure is a thin flat strip of beryllium copper, one end of which is affixed to the mask-holding inner ring 555. The other end has the vacuum cup attached to it. A vacuum inlet 557 is provided so that a vacuum can be drawn inside cup 556 to fixedly and flexibly hold mask upper peripheral edge 563 in the alignment apparatus. The peripheral outer edge 563 of the mask 20 is recessed and spaced within the reentrant recess 561 between the inner extremity of ledge 11b, the underside of inner ring 555 and the mask upper edge 562 and peripheral edge 563. The operating portion of the mask is contained on a membrane 563a stretched across edges 563.

Plate ring 11 bears on a circular bearing pad 552 surrounding the recess 47 in which post 46 upstands. A series of ball bearings 553, in a plastic bearing retainer 554 acts as a thrust bearing to support, rotate, and move plate 11 with respect to fixed fingers 12.

In operation, a mask is positioned by a suitable transport means shown in the aforesaid Novak et al. co-pending application, to a position below aperture 13. Mask 20 is then raised toward vacuum cups which are three in number, equally spaced around inner plate 555 to mount the mask lateral edge 563 of the mask at three equally spaced locations. Imposition of a vacuum in cups 556 hold the mask in horizontal position.

Means, including upstanding spacing members, are provided on a wafer-holding stage to space the mask from a wafer placed below the aligner. The spacing members can assure a set spacing, say 40 microns, between the wafer and mask. Small misalignment or canting of the aligner is compensated for by the up and down movement of the flexure 558 mounted the vacuum cups 556.

Means may be provided for sensing diminishing or lost vacuum in cups 556 due to loss of utilities e.g. vacuum for the system, and for resultant automatic movement inwardly of the shafts of pneumatic or hydraulic cylinders 14–17 to recapture the edges of the mask and preventing in a fail-safe manner the mask from falling out the aligner-holder. Details of such fail-safe arrangement will be apparent to one skilled in the art.

The ring plate and support arms are made of a stable cast iron material. Flexures are made of Be Cu material.

FIG. 16 illustrates the wafer stage used to mount the wafer and to adjust it in six degrees freedom. A wafer is supported on a pin chuck such as that shown in U.S. Pat. No. 4,213,968 or as described in *Solid State Technology*, Volume 25, No. 5 page 23, May 1982 by T. E. Saunders. This chuck permits repeatable repositioning of the wafer at the various processing steps and minimizes the possible top-side distortion caused by particulate contamination in between the wafer and the chuck. The chuck is supported at three points by piezoelectric motors which can tilt the chuck in two axes, or move the wafer in the Z-direction to accommodate wafers of various thicknesses, and to alter the mask-to-wafer gap. These motors are attached to a theta plate which is supported by flexure bearings and which can be rotated by a fourth motor. This assembly is, in turn, attached to a subplate which is supported by air bearings and which can be driven in X and Y directions by piezoelectric motors. All linkages use flexure pivots. The results is a stage which can hold the wafer rigidly with virtually no backlash, yet move it in six degrees of freedom to perform total alignment at extreme resolution.

The alignment apparatus 100 shown in FIG. 16 is alternately designated herein as a wafer stage since its principle application has been in aligning a semiconductor wafer, in which multiple semiconductor integrated circuits are to be fabricated using lithography processes, with one or a series of masks used in the fabrication. The apparatus is contained in a rectangular stage housing 101 which is capable of up and down coarse movement for raising and lowering the overall stage, including the housing, about three inches to allow for wafer and mask loading and unloading. At the top of this motion in the Z-direction the hereafter described fine stage is kinematically located, i.e., has essentially perfect position repeatability.

A rectangular, essentially square x-y motion plate 102 is mounted in housing 101 and supported on a series of three air bearings 122. The housing and supported motion plate 102 is moved upwardly in the coarse Z direction by a coarse Z motor 149 and lead screw 146 (FIG. 2), the housing being guided vertically by a pair of guide rods 103 extending vertically from a fixed support pad 105. The rods extend through a pair of apertured tabs 104 on opposite edges of the housing 101.

An X-drive piezoelectric linear motor 110 is attached to a vertical side wall 109 on the inside of housing 101 and extends parallel to that wall. The linear moving shaft 111 of the motor is connected to one end of a bell crank linkage 112, flexurally pivoted at 113 and connected at its opposite end to a tab 114 extending perpendicularly from an edge of motion plate 102. Linear incremental movement of shaft 111 results in incremental linear movement of the motion plate in the X-axis.

The piezoelectric motors used in this invention output incremental movements of the order of 60 Angstroms. A commercial embodiment of this type of motor is Model PZ-500 known as the Burleigh Inchworm, available from Burleigh Instruments, Fishers, N.Y. This type motor is highly stable in the "off" condition so that it will, after adjustment, dependably lock the wafer into position.

A Y-drive piezoelectric motor 115 is mounted to a bar extending across housing 101 but affixed to the upper surface of housing 101 and has its linearly movable shaft 116 connected to a U-shaped bell crank 117. The crank is connected at its ends to pivots 117a and 117b and links 118, centrally pivoted in flexures 108, are attached at their outer ends to flexures 119 and 121. Flexures 119 and 121 extend into a vertical edge 120 of the motion plate and are flexed when the X-axis motor is operated to move the motion plate in the X-direction and have sufficient stiffness to act as push-pull rods when the Y-axis motor is operated to move the motion plate in the Y-direction.

Motion plate 102 contains three rectangular equispaced cut-outs 123 around its periphery through which pass three vertical mask registration alignments blocks 124, each having a mask registration pad 125 which abuts the underside of a mask assembly (FIG. 4) positioned above the wafer. Motion plate 102 also contains three equispaced circular apertures 126 through which pass vertically oriented Z-drive piezoelectric linear motors 128, 129 and 130. A central aperture 127 receives a bottom end of a theta flexural pivot 138, the other end of which is mounted in aperture 139.

Motors 128-130 are fixedly mounted in depending vertical position on the underside of lobes of a trilobed rotatable theta plate 106. The linear movable shafts 128a, 129a and 130a extend above theta plate 106 to support pads 135 on the underside of wafer-support plate or chuck 134. Motors 128-130 when moved in unison move the wafer in the Z-direction to accommodate wafers of various thickness and to alter the wafer-to-mask gap. When only one or two motors are moved, the plate may be tilted in two axes to compensate for any distortions in the wafer or mask, or in the parallelity between the wafer and mask. Flexures connect the linear moving shafts 128a, 129a and 130a to zero clearance bearings 147 (FIG. 2) captured in the chuck 134 thus permitting angular tilt of the wafer chuck without inducing large bending movements into the linear shafts.

A linear variable differential transformer 158 (LVDT) available from Schaevitz Engineering, Pennsauken, N.J., as Model PAC-220-005, is positioned adjacent to each of the shafts of motors 128-130 which contact the rear of the chuck 134 to sense and control through a closed loop system (not shown) the axial travel of the piezomotors to about 0.2 micron resolution.

A theta-drive piezoelectric linear motor 137 is connected across the walls of the housing 101 in parallel orientation with the x-and-y drive motors which motors are all contained in a common horizontal plane below motion plate 102. Linear moving shaft 131 of motor 137 is connected to a bell crank flexural linkage 132 extending upwardly past the edge of the theta plate to an arm 132a attached to a fixed post 133 on the top of the theta plate. Movement of the link 132a resultant from incremental movement of shaft 131 results in rotative theta movement of plate 106 clockwise or counterclockwise in plan view around flexural pivot 138 which in turn rotates support plate 134 and the mounted wafer. Aperture 136 in the support plate functions to permit motion of a lift pin to facilitate wafer load/unload from the chuck.

Mask registration blocks 124 extend past vertical flats on the edge of the theta plate between each of the lobes with sufficient clearance to allow rotation of the theta plate. The blocks and mask registration pads as a group are set on a diameter greater than the diameter of the circular support plate 134 so that the mask registration pads 125 can extend outwardly from and above the plate 134 to abut and space a mask.

FIG. 17 is a schematic representation of a cross section through the mask and wafer. Before wafer loading, flexure-supported, small vacuum cups at the top of the mask, hold the mask in X, Y and θ position. The vertical location of the mask is not well defined until the stage is raised so that the mask rests on reference pads extending from the wafer-adjusting apparatus. Prior to raising the stage, a gap control sub-system is inserted above the wafer and is used to reference the top surface of the newly-loaded wafer and the mask reference pads. The fine stage adjusts the wafer to preset the gap to 40 micrometers.

In normal operations the mask is set loosely abutting the end of the helium column to effect a nominal seal. An O-ring or flexible lip seal may be attached to the column against which the mask loosely abuts. Since helium is a lighter-than-air gas it raises in the chamber. The helium pressure may be controlled so that the pressure at the interface of the chamber with the mask top is balanced with the ambient or other pressure on the mask bottom. Wafer after wafer is fabricated by the movement of the stage outwardly to receive a wafer and inwardly where it is aligned with the same fixed mask for that particular fabrication operation. A bleed aperture 157 is provided in the mask aligner or on a bottom portion of the helium column so as to allow for excess helium pressure to be relieved thus balancing the pressure on both sides of the mask to prevent bulging of the mask outwardly. This aperture can function also to balance a higher mask-wafer interface ambient pressure which may be a separate helium atmosphere around the mask-wafer interface gap as in U.S. Pat. No. 4,185,202.

FIG. 17 illustrates the function of the mask registration pads 125 extending from the top of registration blocks 124. Pads 125 abut and space the outside frame 152 of the mask 150. A mask aligner 153 spaced above wafer 140 holds and adjusts mask 150 in x, y and θ directions. Frame 152 of the mask is mounted on a flexure 151 attached to the mask aligner 153. Wafer 140 is shown mounted on support plate 134 which is movable by stage assembly 155, as described above, in fine alignment. Small vacuum cups 156 extending on flexures 151 on aligner 153 hold the frame of the mask in position. The vertical location of the mask is not well defined until the stage is raised and the mask rests on the reference pads. Prior to raising the fine stage assembly, a gap control means such as that shown in U.S. Pat. Nos. 4,175,441 and 4,285,053 involving an acoustic method of measuring micron and submicron distances is employed. The means is inserted above the wafer and used to reference and set the top surface of the wafer and the mask reference pads.

The fine stage 155 which includes the mechanisms contained in stage housing 101 has been tested for 1 million cycles and has been found to be virtually maintenance free.

The implementation of flexural pivots at all rotating joints yields a truly zero clearance bearing, permitting extreme accuracy and repeatability of position. The nature of the construction and the use of piezoelectric motors also results in a stage that has no particulate generating members in the vicinity of the wafer itself, a vital consideration in any lithography application. There are no critical adjustments required during the assembly and implementation of this stage and none of the fabrication techniques for any of the stage components are beyond the capabilities of a normal production machine shop.

FIGS. 18 and 19 illustrate in more detail the mask cassette and mechanism for moving the mask from its cassette to its placement in the mask aligning mechanism above the wafer adjusting stage.

FIG. 19 describes, in detail, the mask cassette.

In FIG. 18 a base plate 210 or other fixed structure is provided which extends from a position adjoining a mask holder 220 provided at a fixed location in the lithography apparatus under an X-ray, ultraviolet or ion beam source 206 and above an aligning mechanism for a wafer which is mounted below the mask for graphic imaging. In operation, X-rays 206 pass through the mask onto the wafer (not shown). The wafer itself is mounted on a wafer stage ositioned below the mask holder 220. Such positioning is shown in the above-recited co-pending patent applications.

An in-out cassette holder 212 is fixed to the base plate 210 and the cassette 200 mounting a mask 214 on a bottom tray 202 is mounted by its cover 211 to the in-out mechanism 212. In-out cassette holder 212 may comprise a central apertured platform to support the bottom edges 211a of cassette top 211 and is adapted to move the cassette laterally outward on rails to a position such as position B in FIG. 1. A lift cylinder 218 is positioned below the cassette 200 in position B (FIG. 1). Lift cylinder 218 includes a fluid-operated (liquid or pneumatic) piston 209 and piston rod 217 (217a in the up position) which functions to raise a table having a vacuum cup 216 thereon into a central position at 216a on the underside 213 of tray 202. The tray 202 is then vacuum-attached to cup 216 in its up position, and unlocked from cover 211 so that the tray, vacuum cup 216 and piston rod 217 may be moved to the down position. Thus, mask 214 is removed from cassette cover 211 without any mechanism touching the mask. The lifting cylinder is then rotated or otherwise moved by arm 219 or by suitable rail structure (not shown) to a displaced position laterally along base plate 210. At this displaced position, the lifting cylinder and the tray with its supported mask is positioned below mask holder 220, is raised so that the edges of the mask 214 abut spaced suction cups 221 on the bottom periphery of mask holder 220 and a vacuum drawn to attach the mask to the cups 221. The mask is then in a position to be accurately aligned with respect to the X-rays 206 and the wafer-holding alignment stage.

Alternatively, provision may be made to move cover 211 separately, or with its supporting structure, upwardly after the lift cylinder has been positioned under the tray 202 and the locking means unlocked. The lift cylinder and attached mask-containing tray may then be moved laterally on arm 219 without first moving downwardly.

FIG. 19 is a detailed view of the cassette. It comprises an open-bottom cover 211 of any peripheral shape, such as circular, square or octagonal. A preferably circular bottom tray 202 extends across the open bottom of the cover 211. The edges of the tray 202 and the interior edges of the cover are tapered as at 208 to provide a close, self-aligning fit to prevent ingress of dust or other particles into the confines of the cassette. A mask 214 which normally has a central membrane 214a with the mask operating portions thereon is mounted on a ridge on tray surface 215. Alternatively, as hereafter described, a calibration assembly or device may be placed on the tray surface 215. The cassette top normally has a clear, transparent window 230 on its top side so as to allow visual observation to verify the contents of the cassette.

The cassette is normally colored differently for those cassettes which are to house masks and for those cassettes which are to house quartz calibration plates or assemblies. This further identifies the contents of the cassette, reducing human error.

An anti-rotation pin 222 is provided at one edge of the cassette cover top which permits the tray to be installed in but one, single location, preventing tray misalignment and rotation inside cover 211. Pin 222 registers with and enters into aperture 235 in the peripheral top surface of tray 202. The mask may contain flats for registration with pins 236 or may have V-notches on its periphery meshing with pins 236.

A series of locking members 223 and 224 normally four in number, are placed around the periphery of the vertical walls of the cover 211 in position so that in inward movement, they lock tray 202 into the bottom of cover 211, for example, by abutting surface 208a or entering into apertures in the edge of tray 202. These locking pins normally are spring loaded in the lock position and may be unlocked pneumatically. Thus, a locking means is provided which can only be operated by machine, and a human operator cannot easily open the cassette to disturb or contaminate the mask.

Mask cover 211 also contains an aperture at an exterior bottom position which registers with a pin (not shown) on the in-out loading mechanism 212 so that the mask cassette can be loaded into the mechanism in only one way, thus keying the mask in its rotational orientation to its eventual position on the mask holder. Pins 237 extending through cover 211 and having a mask edge abutting tip may be utilized to prevent shaking or vibration of the mask.

FIG. 20 illustrates the compression optics which are employed in this invention which are substituted for the prior art scanning mirror subsystem shown in FIG. 6.

In FIG. 20, images A and C from a mask and an image B from a wafer are focused at the secondary image position 400 shown in FIG. 20. At this position, these images are linearly polarized in a direction which is either parallel to or perpendicular to a line co-linear with A, B and C. Further magnification is required before these images can be imaged onto a camera 410 for processing and that is accomplished with lens 402. Immediately after the lens, a half wave plate 403 is used to rotate the plane of polarization 45 degrees. The light is passed incident upon polarizing beam splitters 404 and 50% of the light is transmitted while 50% is reflected. These two beams of light pass through ¼ wave plates 405 whereupon the light is changed to circular polarized light, reflect off of mirrors 406 and pass again through the ¼ wave plates 405 and emerge with a plane of polarization orthogonal to the original plane of polarization. Both planes can now pass through the cube 404, or reflect off of the cube as required, towards non-rotating mirror 407 and continue on through fixed mirror 408 if required for the desired light pathway, and continue on to the camera 410.

The images are shown at final image position 409 in FIG. 20. At this point, six spots of light are formed in the plane of the camera, two of which A and C prime are not used. The remaining four must fall onto the face of the camera for proper alignment to take place. Since a high degree of magnification is required from image 402, the middle pairs of spots may be two widespread to fall onto the face of the camera and so a means must be employed to bring those spots closer together.

The prior art as shown in FIG. 6 uses a scanning mirror at mirror location 407. Thus, B, A prime spots are imaged onto the face of the camera for half the time and C, B prime spots are formed on the face of the camera the remaining time. In the present invention since the magnification involved is sufficiently large, the scanning mirror can be replaced with a split fixed mirror having angularly disposed portions 408a 408b at the mirror location. This mirror is placed in such a location so that the light which is going to form images B, A prime falls on the left-hand side of this mirror and the light which will form images C, B prime falls on the right-hand portion of the mirror. Thus, each pair of spots can be independently directed towards the face of the camera. Note that all four spots are incident on the camera face 100% of the time. The advantages of the new system over the prior art is as follows: 1. Elimination of an expensive component (the scanning mirror) which reduces the overall cost of the system.

2. The elimination of a major source of vibration which is the scanning mirror. This vibration can cause various parts of the machine to vibrate and can cause a loss of image quality or alignment accuracy.

3. Since the light is falling on the camera from each spot 100% of the time instead of 50% of the time, the signal is improvedd accordingly.

If the magnification is not sufficiently high, the light which forms these spots may not be sufficiently separated to allow the use of the split mirror at location 408. On the other hand, if the magnification is quite low, all four spots form on the camera face anyway, and neither the scanning mirror or the split mirror technique is required. It is anticipated that the scanning mirror will continue to have use where, for some reason, an intermediate magnification must be employed. The advantages, in general, of eliminating the scanning mirror are sufficiently great to cause a magnification to be used which is either greater or lower than a value which forces the design into using the scanning mirror approach.

The electronic system which is utilized in the disclosed lithography system incorporates a distributed processing strategy, with the host computer keeping track of the overall system and dedicated processors for automatic alignment and DC motor servos. The user interface is through the CRT which can display the status of the entire system or the detailed status of any sub-system. Typical operation is through a control panel and keyboard. The system includes cassette-to-cassette wafer handling, two redundant systems of safety interlocks for safer operation and maintenance, an environmental system for maintaining a constant ±0.2° F. temperature, and a particulate-free environment. The electronic packages, including the displays, and safety features, are within the skill-of-the-art and are in accord with standard commercial practice.

The above description of embodiments of this invention is intended to be illustrative and not limiting. Other embodiments of this invention will be obvious to those skilled in the art in view of the above disclosure.

I claim:

1. A lithography system for a substrate printing sequence comprising:
a beam chamber having a gaseous interior environment of high permeability to x-rays;

means for mounting a x-ray beam source adjacent one end of the chamber;

means for adjustably mounting a mask at a position across an opposite end of said chamber;

means for movably mounting a plurality of objective lenses in said chamber above said mask;

means for movably mounting a substrate in parallelism to and at a side of said mask opposite said source to receive a beam image extending through said mask;

means for providing alignment targets on each of said mask and said substrate; and means, including a laser light source, said objective lenses and optics, for aligning said alignment targets on said mask with respect to said alignment targets on said substrate by relative movement of said mask and substrate with respect to each other, said optics being located exteriorly of said beam chamber.

2. The system of claim 1 including a laser light transmitting window in said chamber to pass incident laser illumination to said targets and target alignment information from said plurality of objective lenses to said optics.

3. The system of claim 1 including a mask positioner for movably holding and adjusting said mask on said chamber.

4. The system of claim 1 in which said mask is mounted for in situ adjustible movement with respect said chamber.

* * * * *